(12) United States Patent
Schmitt et al.

(10) Patent No.: US 6,181,565 B1
(45) Date of Patent: Jan. 30, 2001

(54) COMPUTER WITH EXPANSION CARD GUIDING AND LATCHING DEVICE

(75) Inventors: Ty Schmitt; George Thomas Holt, both of Round Rock, TX (US)

(73) Assignee: Dell USA, L.P., Round Rock, TX (US)

( * ) Notice: Under 35 U.S.C. 154(b), the term of this patent shall be extended for 0 days.

(21) Appl. No.: 09/228,996

(22) Filed: Jan. 12, 1999

(51) Int. Cl.⁷ .............................. H05K 7/12; H05K 7/14
(52) U.S. Cl. .................. 361/756; 361/683; 361/753; 361/759; 361/801; 361/802; 211/41.17
(58) Field of Search ..................... 361/683, 752–753, 361/756, 759, 796, 797, 801, 802; 211/41.17; 439/152

(56) References Cited

U.S. PATENT DOCUMENTS

| | | |
|---|---|---|
| 4,744,006 | 5/1988 | Duffield . |
| 4,924,355 | 5/1990 | Mitchell et al. . |
| 5,051,096 | 9/1991 | Cooke et al. . |
| 5,191,514 * | 3/1993 | Kabat et al. ........................ 361/801 |
| 5,317,483 | 5/1994 | Swindler . |
| 5,338,214 | 8/1994 | Steffes et al. . |
| 5,544,006 | 8/1996 | Radloff et al. . |
| 5,575,546 | 11/1996 | Radloff . |
| 5,594,627 * | 1/1997 | Le ........................................ 361/801 |
| 5,765,008 | 6/1998 | Desai et al. . |
| 5,781,414 | 7/1998 | Mills et al. . |
| 5,914,854 * | 6/1999 | Holt .................................... 361/683 |
| 5,927,389 * | 7/1999 | Gonsalves et al. .............. 361/801 X |

* cited by examiner

Primary Examiner—Jayprakash N. Gandhi
(74) Attorney, Agent, or Firm—Haynes and Boone, LLP

(57) ABSTRACT

A computer including a guiding and latching device for mounting expansion cards in the chassis of the computer. The device includes a body member defining a slot and comprising a latch movable between a non-latching position in which the slot can receive the board and a latching position in which the board is latched in the slot. The device is formed of one piece and includes a flexible arm that pivots between a latching and a non-latching position.

19 Claims, 3 Drawing Sheets

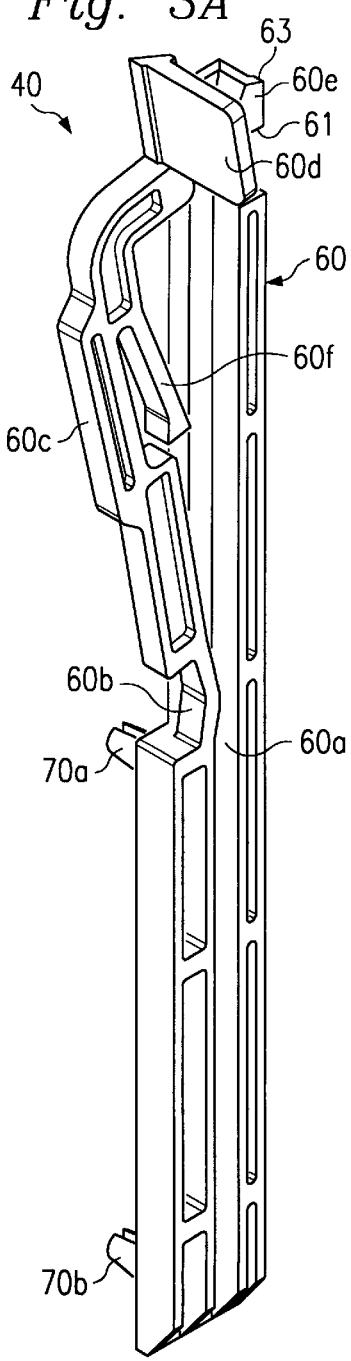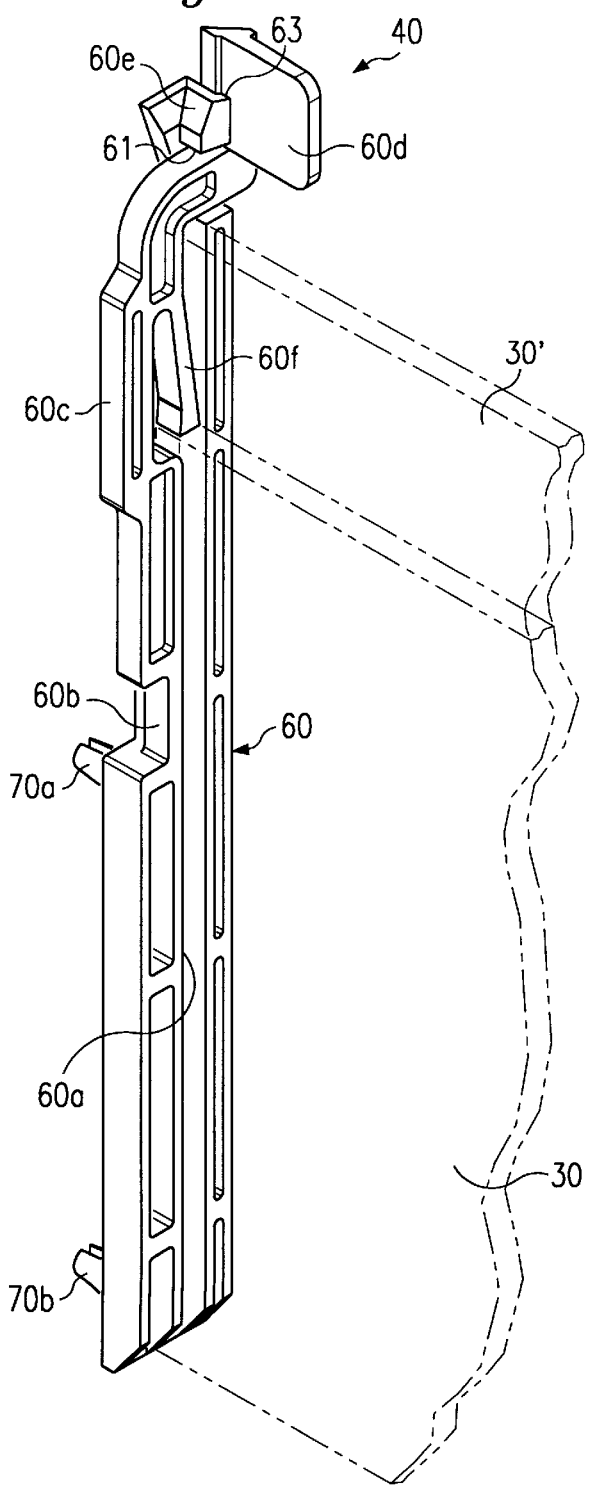

COMPUTER WITH EXPANSION CARD GUIDING AND LATCHING DEVICE

BACKGROUND

The present disclosure relates to a computer and, more particularly, to a computer having a device for guiding and latching an expansion card within the chassis of the computer.

Because of limitations in the useful size of planar circuit boards in computer applications, and in order to provide consumer flexibility, the chassis of the computer, and/or a cage structure within the chassis, are frequently designed to accommodate additional circuit boards, which are referred to as "expansion cards," for peripheral devices to provide additional and/or alternative functionality.

For example, many personal computer circuit boards are designed with standard bus interfaces, such as ISA (Industry Standard Architecture) and EISA (Extended Industry Standard Architecture), into which expansion cards for peripheral devices, such as hard disk controllers, tape controllers, modems and other I/O controllers, may be connected. Thus, a user or service technician may easily add or exchange a peripheral expansion device, such as a modem, by simply adding a new modem card or replacing the old modem card attached to the bus interface with an improved card.

Typically, expansion cards are electrically connected to the circuit board through the use of "female" edge connectors located on the circuit board. These type of connectors contain a number of electrically conductive pins enclosed in a "female" receptacle for receiving a "male" connector portion of the card. This male card portion is designed with contacts corresponding to each pin in the female edge connector, so that when the male card portion is press-fitted into the female receptacle, the corresponding pins of the female edge connector are biased against the respective signal contacts on the male card portion to create a secure electrical connection between the contacts and the connector pins. The female edge connector not only creates a secure electrical connection between the expansion card connector portion and the female edge connector, but also secures the expansion card in place.

However, in these types of designs it is often difficult to manually press-fit an expansion card into its exact position in an edge connector. Also, even if initially press-fitted properly, the card will sometimes move relative to the edge connector, often as a result of an unbalanced weight distribution of components on the card, or due to movement of the computer system, such as in shipping, or the like. Of course, when this movement of the expansion card occurs, contact between the pins in the female edge connector and the contacts on the male connector portion of the card may disengage, causing the card to momentarily, or permanently, lose its electrical connection with the female edge connector. Such electrical disconnects can result in transient or catastrophic faults in the computer system.

Prior art designs have attempted to overcome the above problems by employing card guides and latches on the boards, the chassis, or the cage structure for the cards. The guides usually function to receive one end of the card and guide it into the proper position and the latch is formed separately from the guide and functions to secure the card in the proper position. However, because these guides and latches are formed separately, they are relatively expensive and, in addition, take up valuable circuit board and/or chassis space.

Therefore, what is needed is a guide and latch device for expansion cards in the above described environment which is relatively inexpensive and which occupies relatively little circuit board space.

SUMMARY

The present disclosure, accordingly, is directed to a guiding and latching device for mounting expansion cards in a computer, or other electronic component. The device includes a body member defining a slot and comprising a latch movable between a non-latching position in which the slot can receive the board and a latching position in which the board is latched in the slot. The device is formed of one piece and includes a flexible arm that pivots between the latching and the non-latching position.

The device enjoys the advantages of being relatively inexpensive and occupying relatively little circuit board space.

BRIEF DESCRIPTION OF THE DRAWINGS

FIGS. 3A and 3B are enlarged, isometric views of a guiding and latching device used in the computer of FIG. 2 and shown in two different modes.

DESCRIPTION OF THE PREFERRED EMBODIMENT

Figure 1:
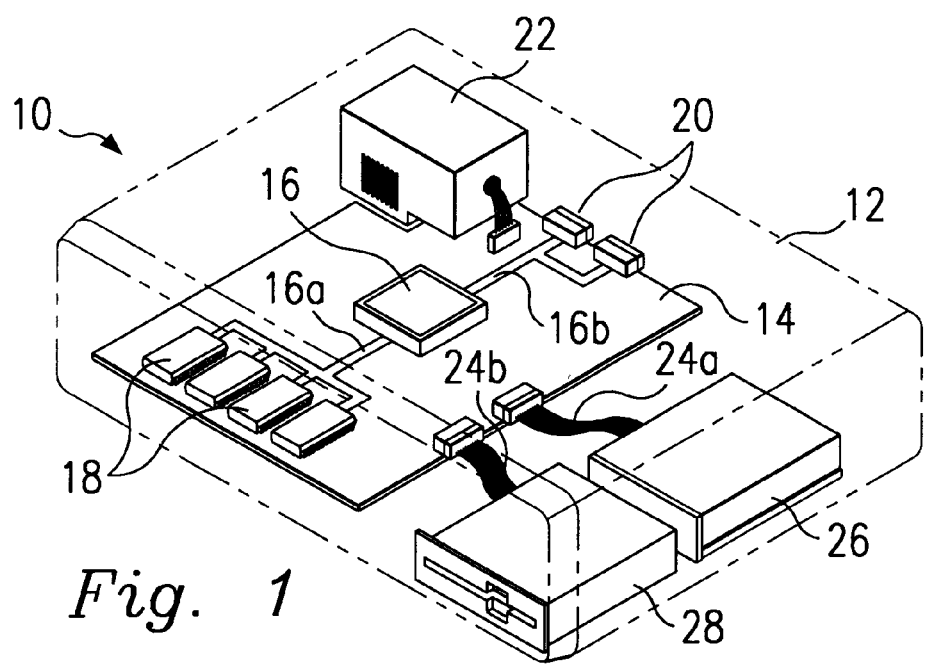
FIG. 1 is a diagrammatic representation of a computer according to an embodiment of the present disclosure.

An embodiment of the present disclosure is shown in FIG. 1 in connection with a computer, referred to, in general, by the reference numeral 10, which can be in the form of a server, a tower computer, a desktop computer, a laptop computer, or the like. The computer 10 includes a chassis 12 in which a motherboard 14 is mounted. A processor 16 is mounted on the motherboard 14 along with a plurality of memory devices, or modules, 18 and two input/output (I/O) devices 20. Two buses 16a and 16b are also provided on the motherboard 14 and connect the processor 16 to the memory modules 18 and to the input/output devices 20, respectively. A power supply 22 is connected to the motherboard 14, and a pair of cable assemblies 24a and 24b connect the motherboard 14 to a hard drive unit 26 and a disk drive unit 28, respectively. It is understood that other components, electrical traces, electrical circuits and related devices (not shown) are provided in the chassis 12. Since these are all conventional, they will not be described in any further detail.

Figure 2:
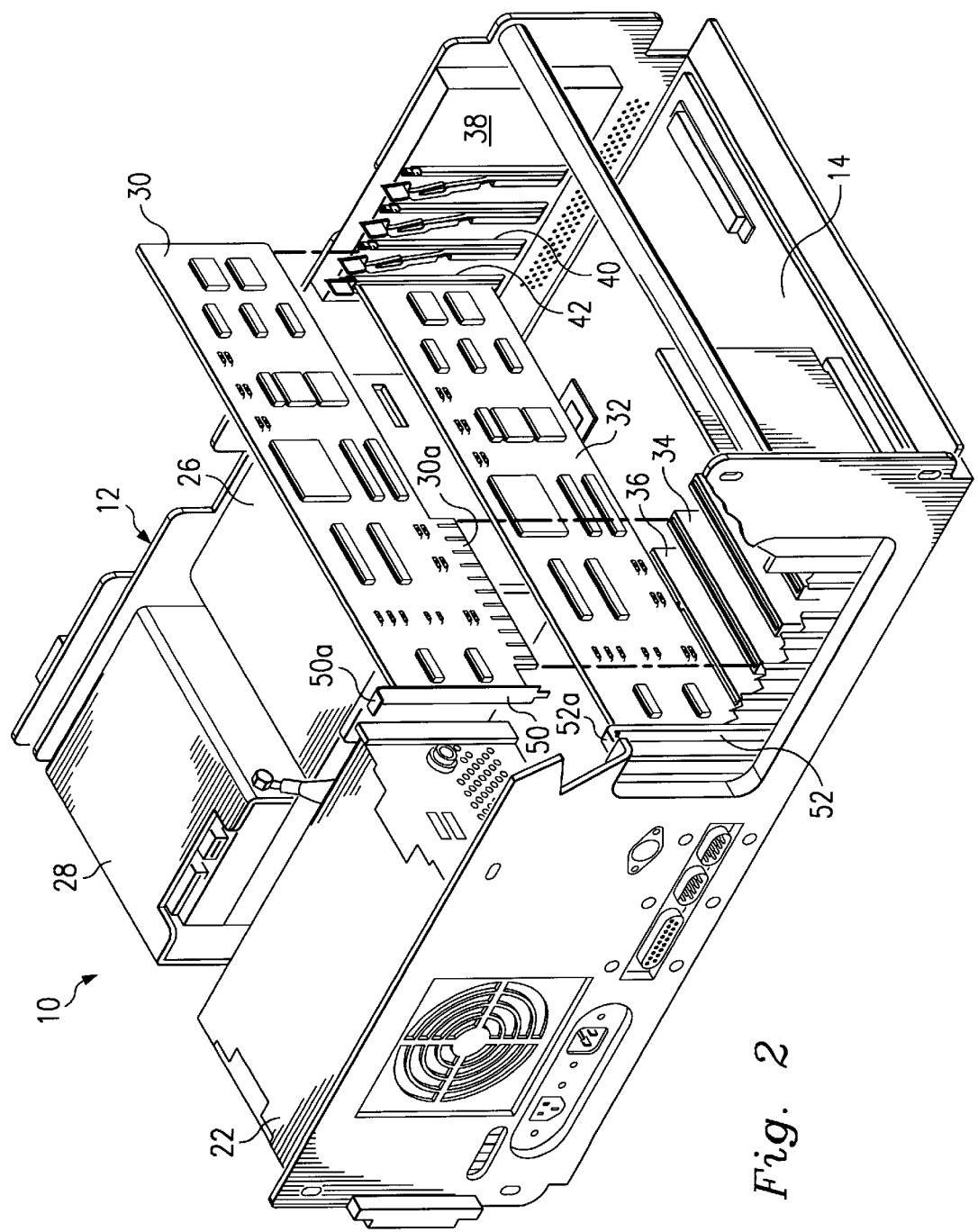
FIG. 2 is an isometric view of the computer of FIG. 1, taken from the rear thereof.

FIG. 2 depicts an example of a specific design of the interior of the chassis 12 which is designed to receive a series of printed circuit boards, or expansion cards, two of which are referred to by the reference numerals 30 and 32. Each of the cards 30 and 32 have electrical components mounted thereon and interconnected by printed circuit wiring, in a conventional manner. The card 30 is shown in an elevated position relative to the chassis 12, and the card 32 is shown mounted in the chassis 12.

A set of female edge connectors, two of which are referred to by the reference numerals 34 and 36, are mounted on the mother board 14 and are adapted to receive the cards 30 and 32, respectively. To this end, and with reference to the card 30 and its corresponding edge connector 34, for example, an extended portion 30a is formed along the lower edge portion of the card 30, as viewed in FIG. 2, and is adapted to extend in a slot formed in the edge connector 34. It is understood that the connector 34 contains a number of electrically conductive pins enclosed in a "female" receptacle, and the extended portion 30a of the card 30 is provided with contacts corresponding to each pin in the female edge connector 34. Therefore, when the extended portion 30a is press-fitted into this female receptacle of the connector 34, the corresponding pins of the connector 34 are biased against the respective signal contacts on the extended portion 30a to create a secure electrical connection between the contacts and the connector pins. Because this is conventional, it will not be described in further detail. It is understood that the card 32 and the edge connector 36 are identical to the card 32 and the connector 34, respectively.

A support bracket 38 is secured to the inner surface of the front wall of the chassis 12 in any known manner, and a series of guiding and latching devices, two of which are referred to by the reference numerals 40 and 42, are mounted to the support bracket 38 in a manner to be described. The devices 40 and 42 are adapted to receive end portions of the cards 30 and 32, respectively, and guide and locate same in the chassis 12. In addition, the devices 40 and 42 function to latch to the cards 30 and 32, respectively, in their mounted position in the chassis 12 as shown in connection with the card 32 in FIG. 2. The devices 40 and 42 will be described in detail later.

Two brackets 50 and 52 are mechanically attached to the other ends of the cards 30 and 32, respectively, in a conventional manner and function to support the cards 30a and 32, and secure them in their operative position in the chassis 12 as shown by the card 32. The brackets 50 and 52 extend in a plane perpendicular to the plane of the cards 30 and 32, respectively, and have bent tabs 50a and 52a formed at their upper ends, as viewed in FIG. 2. Although not clear from the drawings, it is understood that the tabs 50a and 52a are attached to the chassis 12 by bolts, or other type fasteners (not shown) that extend through aligned openings in the tabs 50a, 52a and the chassis 12, to secure the cards 30 and 32, respectively, to the chassis 12. Because the brackets 50 and 52, and the method of mounting them to the chassis 12, are conventional they will not be described in any further detail.

Although not shown in the drawing, it is understood that standard connectors can be mounted on the brackets 50 and 52 so as to be exposed through an appropriate opening in the rear wall of the chassis 12. These latter connectors, of course, receive cables for connecting peripheral componentry to the computer 10 through the cards 30 and 32, in a conventional manner.

It is noted that, although only two cards 30 and 32 are shown and described for the purposes of example, the chassis 12 contains extra connectors, identical to the connectors 34 and 36, and extra guiding and latching devices, identical to the devices 40 and 42, for accommodating additional cards.

The guiding and latching device 40 is shown in detail in FIGS. 3A and 3B in a rest position and in a latching position, respectively. The device 40 is in the form of an elongated body member 60 molded from one piece of material, preferably plastic. A central longitudinal slot 60a extends the full length of the body member 60 for receiving the corresponding end of the expansion card 30. The structure of the body member 60 to each side of the slot 60a is provided with a series of spaced recesses for the purpose of reducing the weight of the device and to assist in the molding process.

A flexible tab 60b connects an upper arm portion 60c of the side of the body member 60 extending to the left of the slot 60a, as viewed in FIG. 3A, to the remaining side portion. As a result, the arm portion 60c can pivot with respect to the remaining portion of the body member 60 between the positions shown in FIGS. 3A and 3B, for reasons to be described.

A tab 60d is provided on the upper end of the arm portion 60c of the body member 60 and extends perpendicular to the body member 60. A tab 60e is provided on the upper end on the side of the body member 60 extending to the right of the slot as viewed in FIG. 3A, and a notch 61 is formed just below the latter tab. In the rest, non-latching position of the arm portion 60d shown in FIG. 3A, the tab 60d extends just to the left of the tab 60e.

When it is desired to guide and latch the expansion card 30, the corresponding end of the card is placed in the slot 60a of the body member 60 as shown in FIG. 3B. The arm portion 60c of the body member 60 is then flexed towards the tab 60e and manually placed in the position shown in FIG. 3B. In the latter position, the tab 60d is located to the right side of the tab 60e in engagement therewith, with the arm portion 60c extending just below the tab 60d extending in the above-mentioned notch 61. Also, as shown in FIG. 3B, a hook portion 63 of the tab 60e engages an enlarged portion on the corresponding surface of the tab 60d to maintain the tabs in this position. The card 30 is thus latched in the device 40.

The device 40 is also adapted to receive an expansion card 30' which has a greater height than the card 30 and which is shown by the dotted lines in FIG. 3B. To this end, a flexible tab 60f is provided in the interior of the body member 60 and is adapted to extend in the upper portion of the slot 60a when accommodating the card 30, as shown in FIG. 3B. In this position, the tab 60f, in effect, blocks the upper portion of the slot and engages the upper end of the card 30' to guide and locate the card in the remaining portion of the slot 60a. The tab 60f can also be pivoted away from the card (to the left as viewed in FIG. 3B) to a position (not shown) in which it does not block the upper portion of the slot 60b thus permitting the card 30' to occupy the entire slot.

Two spit pegs 70a and 70b extend from the back side of the body member 60 to enable it to be quickly connected to the support bracket 38 (FIG. 2).

It is understood that the device 42, as well as the other guiding and latching devices shown in FIG. 2 are identical to the device 40.

To install an expansion card, such as the card 30, in the chassis 12, the card is placed in the position shown in FIG. 2, i.e., in a slightly elevated position relative to the chassis 12. The card 30 is then lowered until the extended edge portion 30a of the card extends in the edge connector 34 and the end of the card opposite the bracket 50 extends in the slot 60a of the device 40. The device 40 is latched to the latter end of the card 30 by moving the arm portion 60c of the body member 60 from the position of FIG. 3A to the position of FIG. 3B, as described above. In this position of the card 30, the above-mentioned openings in the chassis 12, and in the tab 50a of the bracket 50, are aligned and a bolt, or other type fastener, (not shown) is placed through the openings, to secure the corresponding end portion of the card 50 to the chassis. The extended portion 30a of the card 30 is thus secured in the connector 34 and the card is secured at both ends to the chassis 12.

Of course, the card 32, and any other additional cards can be installed in the chassis 12 in the same manner.

Several advantages arise from the above embodiment. For example, each device 40 and 42 is molded from one piece of material, is relatively inexpensive, and does not occupy an inordinate amount of space in the chassis.

It is understood that variations can be made in the foregoing without departing from the scope of the disclosure. For example, the disclosure is not limited to the mounting of printed circuit boards that function only as expansion cards, but is equally applicable to any printed circuit board. Also, the disclosure is not limited to a computer but is equally applicable to any electronic device containing a printed circuit board. Further, the references to "upper", "lower", "right" and "left" are done only for the convenience of presentation and are not intended to be limiting as to any specific location or orientation of a component of the embodiment described above. Also, the number of the expansion cards 30 and 32 and their associated guiding and latching devices 40 and 42 can be varied within the scope of the disclosure. Still further, it is understood that the expansion cards 30 and 32 do not necessarily have to be mounted to the chassis 12 in the specific manner described above. For, example, a modular cage structure, or sub-assembly, could be provided which receives the expansion cards 30 and 32, includes the guiding and latching devices 40 and 42, and is mounted to the chassis 12 in any known manner.

Other modifications, changes and substitutions are intended in the foregoing disclosure and in some instances some features of the disclosure will be employed without a corresponding use of other features. Accordingly, it is appropriate that the appended claims be construed broadly and in a manner consistent with the scope of the disclosure.

What is claimed is:

1. A computer comprising;
    a chassis;
    a memory disposed in the chassis;
    a storage disposed in the chassis;
    a printed circuit board;
    a device disposed in the chassis and comprising a body member defining a slot and including a latch movable between a non-latching position, in which the slot can receive the board, and a latching position in which the board is latched in the slot;
    the body member being formed of one piece and the latch being a flexible arm that pivots relative to the remaining portion of the body member between the latching and the non-latching positions;
    a tab formed on the arm; and
    a tab formed on the remaining portion of the body member, the tabs being adapted to engage and retain the arm in its latching position.

2. The computer of claim 1 wherein the slot extends the full length of the body member and divides the body member into two portions, the arm forming a portion of one of the body member portions.

3. The computer of claim 2 wherein the tabs are formed on the respective ends of the arm and the other body member portion.

4. The computer of claim 1 further comprising a flexible tab provided in the interior of the body member and normally extending in one end portion of the slot to block the latter portion of the slot and guide and locate the board in the remaining portion of the slot, the tab being pivotal to a position in which it does not block the one end portion of the slot, thus permitting a board of a greater size to occupy the entire slot.

5. The computer of claim 1 wherein the slot is adapted to receive one end of the board and further comprising a mounting bracket formed on the other end of the board, and at least one fastener for connecting the mounting bracket to the chassis.

6. The computer of claim 1 comprising a bracket secured to the chassis, and further comprising at least one split peg for extending in the opening for quickly attaching the body member to the bracket.

7. An electronic component comprising.
    at least one chassis;
    a printed circuit board;
    a device disposed in the chassis and comprising a body member defining a slot and including a latch movable between a non-latching position in which the slot can receive the board, and a latching position in which the board is latched in the slot;
    the body member being formed of one piece and the latch being a flexible arm that pivots relative to the remaining portion of the body member between the latching and the non-latching positions;
    a tab formed on the arm; and
    a tab formed on the remaining portion of the body member, the tabs adapted to engage and retain the arm in its latching position.

8. The component of claim 7 wherein the slot extends the full length of the body member and divides the body member into two portions, the arm forming a portion of one of the body member portions.

9. The component of claim 8 wherein the tabs are formed on the respective ends of the arm and the other body member portion.

10. The component of claim 7 further comprising a flexible tab provided in the interior of the body member and normally extending in one end portion of the slot to block the latter portion of the slot and guide and locate the board in the remaining portion of the slot, the tab being pivotal to a position in which it does not block the one end portion of the slot, thus permitting a board of a greater size to occupy the entire slot.

11. The component of claim 7 wherein the slot is adapted to receive one end of the board and further comprising a mounting bracket formed on the other end of the board, and at least one fastener for connecting the mounting bracket to the chassis.

12. The component of claim 7 wherein the body member further comprises a bracket secured to the chassis, and further comprising at least one split peg for extending in the opening for quickly attaching the body member to the bracket.

13. A guiding and latching device for a printed circuit board, the device comprising;
    a body member defining a slot and including a latch movable between a non-latching position, in which the slot can receive the board, and a latching position in which the board is latched in the slot;
    the body member being formed of one piece and the latch being a flexible arm that pivots relative to the remaining portion of the body member between the latching and non-latching positions;
    a tab formed on the arm; and
    a tab formed on the remaining portion of the body member, the tabs adapted to engage and retain the arm in its latching position.

14. The device of claim 13 wherein the slot extends the full length of the body member and divides the body member into two portions, the arm forming a portion of one of the body member portions.

15. The device of claim 14 wherein the tabs are formed on the respective ends of the arm and the other body member portion.

16. The device of claim 13 further comprising a flexible tab provided in the interior of the body member and normally extending in one end portion of the slot to block the latter portion of the slot and guide and locate the board in the remaining portion of the slot, the tab being pivotal to a position in which it does not block the one end portion of the slot, thus permitting a board of a greater size to occupy the entire slot.

17. The device of claim 13 wherein the slot is adapted to receive one end of the board and further comprising a mounting bracket formed on the other end of the board.

18. A method of guiding and latching a printed circuit board, the method comprising the steps of:

inserting a portion of the board in a slot in a body member;

pivoting an arm of the body member relative to the slot to secure the board in the slot; and latching a tab on the arm to a tab on the remaining portion of the body member to latch the board in a secured position.

19. The method of claim 18 further comprising the step of providing a flexible tab in the interior of the body member and normally extending in one end portion of the slot to block the latter portion of the slot and guide and locate the board in the remaining portion of the slot, and pivoting the tab to a position in which it does not block the one end portion of the slot, thus permitting a board of a greater size to occupy the entire slot.

* * * * *